United States Patent
Kitagawa et al.

[11] Patent Number: 6,151,235
[45] Date of Patent: Nov. 21, 2000

[54] CARD TYPE SEMICONDUCTOR MEMORY DEVICE FOR STORING ANALOG IMAGE SIGNALS IN SEPARATE ANALOG MEMORY CARD UNITS

[75] Inventors: Shuji Kitagawa; Fumitaka Okamoto, both of Ibaraki, Japan

[73] Assignee: NuCORE Technology Inc., Santa Clara, Calif.

[21] Appl. No.: 09/399,972

[22] Filed: Sep. 21, 1999

[30] Foreign Application Priority Data

Sep. 22, 1998 [JP] Japan ................................. 10-267753

[51] Int. Cl.[7] .................................................. G11C 27/00
[52] U.S. Cl. ................................ 365/45; 365/63; 365/64; 365/185.03; 361/720; 348/719
[58] Field of Search .................... 365/45, 63, 64, 365/185.03; 361/720; 348/719

[56] References Cited

U.S. PATENT DOCUMENTS

| | | | |
|---|---|---|---|
| 4,910,706 | 3/1990 | Hyatt | 365/45 |
| 5,301,240 | 4/1994 | Stockum et al. | 382/1 |
| 5,329,484 | 7/1994 | Tsuiki | 365/45 |
| 5,486,876 | 1/1996 | Lew et al. | 348/719 |
| 5,621,347 | 4/1997 | Saito et al. | 327/540 |
| 5,745,409 | 4/1998 | Wong et al. | 365/185.03 |
| 5,764,560 | 6/1998 | Lee et al. | 365/45 |
| 5,889,654 | 3/1999 | Pierson et al. | 361/720 |

*Primary Examiner*—David Nelms
*Assistant Examiner*—Connie C Yoha
*Attorney, Agent, or Firm*—Townsend and Townsend and Crew LLP; Kenneth R. Allen

[57] ABSTRACT

In a card type semiconductor memory device, a plurality of memory chips each of which stores, as analog values, a still image formed from a color interleaved analog image signal using analog nonvolatile semiconductor memories for writing/reading color interleaved analog image signals having analog luminance information of predetermined colors in units of pixels, and a connector for connecting a number of signal lines for transferring various signals between the memory chips and a host device to the host device side are arranged on a card-like substrate. An analog signal line group from each memory chip is separated from a digital signal line group on the substrate via a separation strip formed from a wide conductive pattern, and concentratedly laid out at positions of the connector, which are separated from the digital signal line group. In each memory chip, terminals for analog signals are concentrated to a terminal array provided on a predetermined side of the chip package. The memory chips are parallelly arranged in a direction in which the sides are close to each other on the substrate.

6 Claims, 6 Drawing Sheets

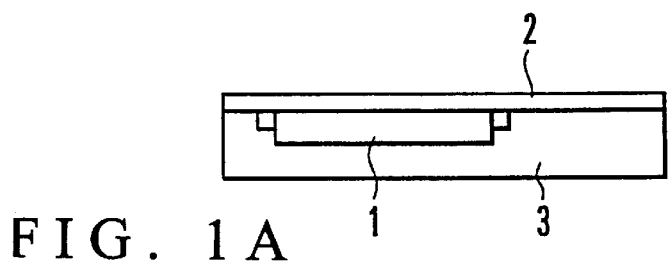
FIG. 1A
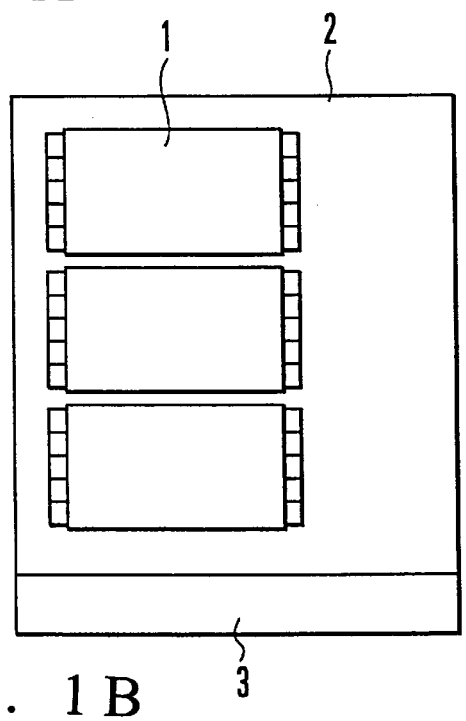
FIG. 1B
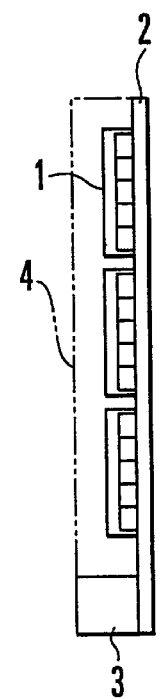
FIG. 1D
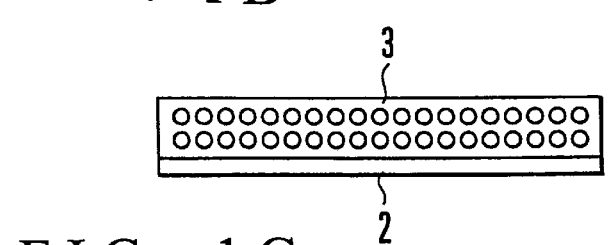
FIG. 1C
FIG. 1

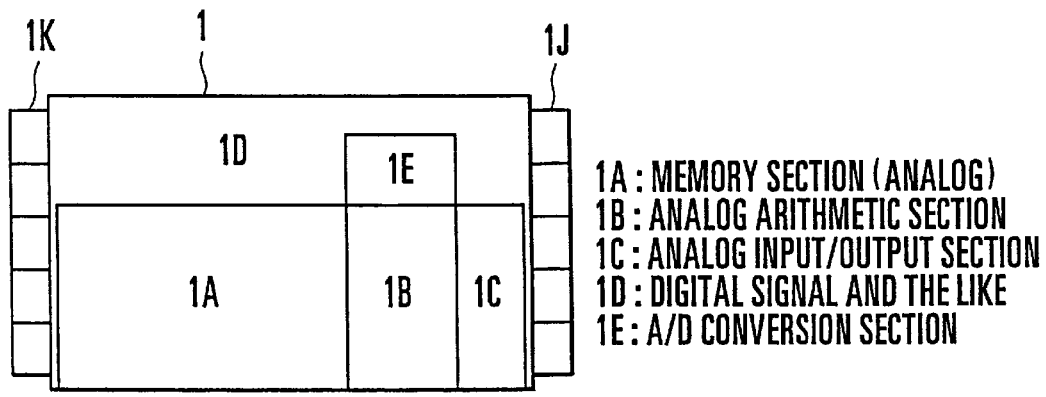
FIG. 7
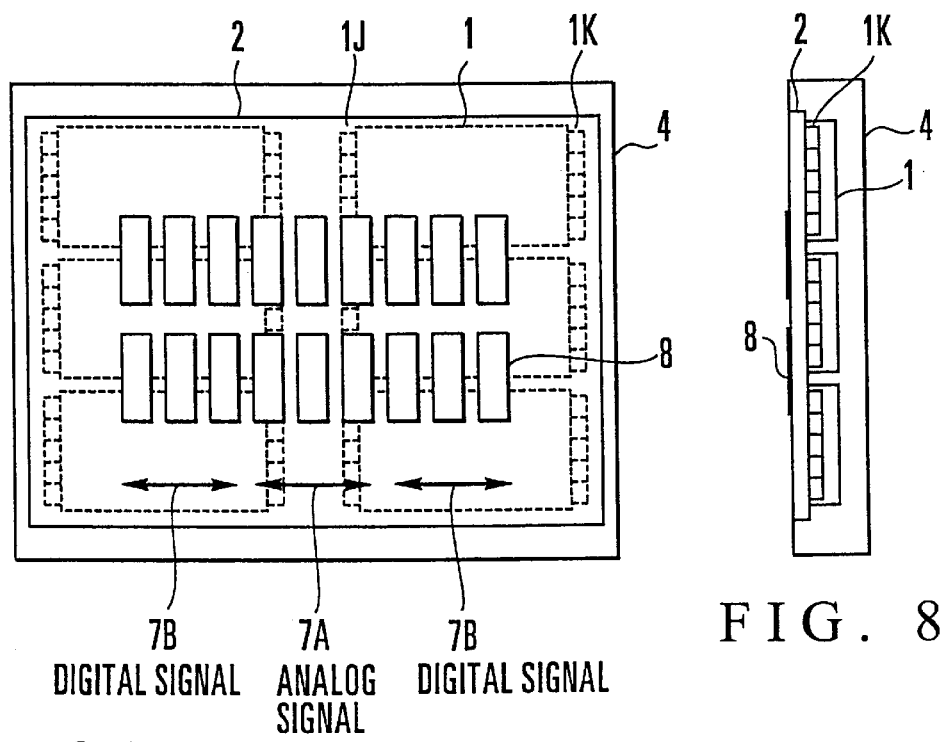
FIG. 8A
FIG. 8B
FIG. 8

CARD TYPE SEMICONDUCTOR MEMORY DEVICE FOR STORING ANALOG IMAGE SIGNALS IN SEPARATE ANALOG MEMORY CARD UNITS

BACKGROUND OF THE INVENTION

The present invention relates to a card type semiconductor memory device and, more particularly, to a card type semiconductor memory device for storing a color interleaved analog image signal obtained using an image sensing element.

Generally, in an image sensing element for photographing a color still image, color filters of different colors (e.g., RGB: red, green, and blue) are arrayed in a Bayer matrix (checkerboard pattern) in units of pixels, and the luminance of an object image is detected at each pixel position.

A still image formed from the luminance values of the pixels is output as a color interleaved analog image signal made of analog signals which have amplitudes representing the respective luminance values and are discrete on the time axis.

Conventionally, for, e.g., a digital still camera apparatus, a scheme using, as a medium for storing a still image, a nonvolatile semiconductor memory for storing an analog signal as an analog value has been examined because a still image obtained with an image sensing element must be stored at a high speed.

As storage media of this type, card type semiconductor memory devices (e.g., memory cards) detachable from a digital still camera apparatus have also been proposed, through they store digital data. Card type nonvolatile semiconductor memories for storing analog signals have also been examined.

However, in such a card type semiconductor memory device for storing an analog signal, when analog signal lines and digital signal lines are mixed and connected in the connector of the card type semiconductor memory device, as shown in FIG. 9, a digital signal interferes with an analog signal, and noise mixes into a still image signal. Especially when the card type semiconductor memory device is compact, the influence of noise becomes more conspicuous.

SUMMARY OF THE INVENTION

The present invention has been made to solve the above problem, and has as its object to provide a card type semiconductor memory device which can minimize the influence of a digital signal on an analog signal such as a color interleaved analog signal.

In order to achieve the above object, according to the present invention, there is provided a card type semiconductor memory device, wherein a plurality of memory chips each of which stores, as analog values, a still image formed from a color interleaved analog image signal using analog nonvolatile semiconductor memories for writing/reading color interleaved analog image signals having analog luminance information of predetermined colors in units of pixels, and connection means for connecting a number of signal lines for transferring various signals between the memory chips and a host device to the host device side are arranged on a card-like substrate, an analog signal line group from each memory chip is separated from a digital signal line group on the substrate via a separation strip formed from a wide conductive pattern, and concentratedly laid out at positions of the connection means, which are separated from the digital signal line group, and in each memory chip, terminals for analog signals are concentrated to a terminal array provided on a predetermined side of a chip package, and the memory chips are parallelly arranged in a direction in which the sides are close to each other on the substrate.

BRIEF DESCRIPTION OF THE INVENTION

FIG. 1 consisting of FIGS. 1A–1D, are respectively first edge, top, second edge, and third edge views which is an explanatory view showing the arrangement of a card type semiconductor memory device according to an embodiment of the present invention;

FIG. 7 is an explanatory view showing the arrangement of a memory chip;

Figure 9:
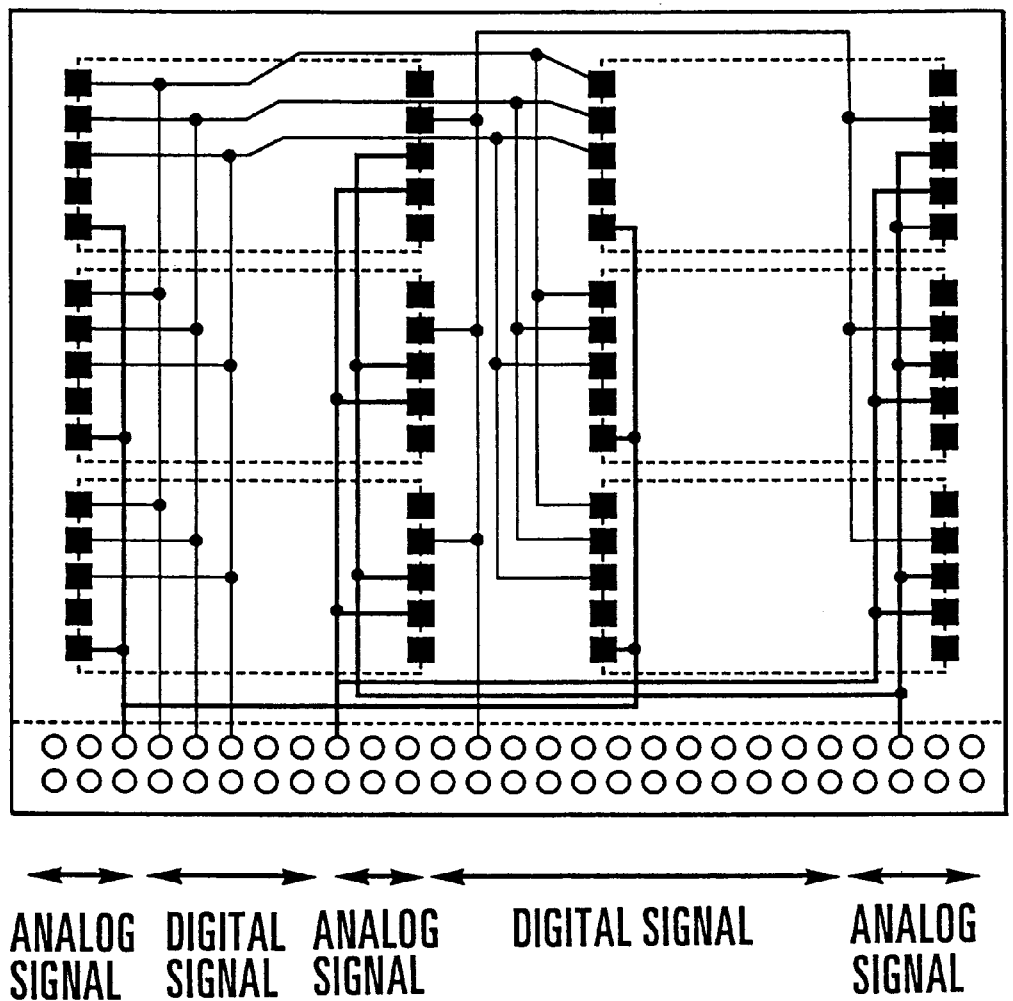

FIG. 8 consisting of FIGS. 8A and 8B, are respectively top and edge views which is an explanatory view showing an arrangement using a connector of terminal contact type; and FIG. 9 is an explanatory view showing a conventional wiring pattern.

DESCRIPTION OF THE PREFERRED EMBODIMENT

The present invention will be described next with reference to the accompanying drawings.

FIG. 1 shows the arrangement of a card type semiconductor memory device according to an embodiment of the present invention.

Referring to FIG. 1, a plurality of memory chips 1 are mounted on a card-like substrate 2 and covered with a card cover 4.

Some of address signals (not shown) input from an external device through a connector 3 connected to one end of the substrate 2 are decoded to select one of the memory chips 1. A color interleaved analog image signal obtained with an image sensing element is written in the selected memory chip.

A color interleaved analog image signal stored in one of the memory chips 1, which is selected in the same way as described above, is read out through an analog input/output section. The color interleaved analog image signal is subjected to analog calculation in the memory chip, converted into a color image signal (analog RGB signals), as needed, and output.

Figure 2:
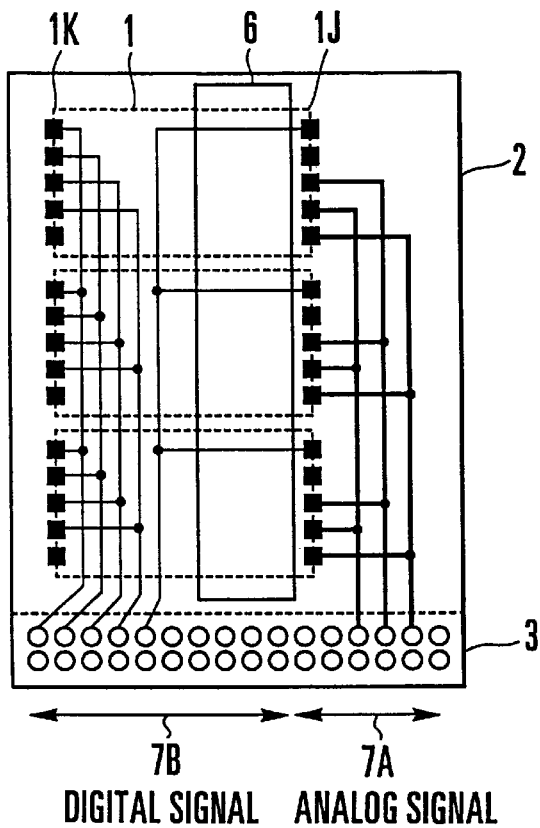
FIG. 2 is an explanatory view showing a wiring pattern in FIG. 1.

FIG. 2 shows the wiring pattern.

In this case, lines for analog signals 7A including color interleaved analog image signals and color image signals (bold lines in FIG. 2: analog signal line group) and lines for digital signals 7B including address signals and control signals (thin lines in FIG. 2: digital signal line group) are separated on the wiring pattern surface of the substrate 2.

Especially, a separation strip 6 formed from a wide conductive pattern is formed between the analog signals 7A and the digital signals 7B, as shown in FIG. 2.

The analog signals 7A are concentrated to terminals of the connector 3 which are at positions separated from the digital signals 7B.

With this arrangement, interference from the digital signals 7B can be reduced.

In each memory chip 1, the terminals for the analog signals 7A are concentrated to a predetermined side 1J of the chip package.

The memory chips 1 are parallelly arranged on the substrate 2 in a direction in which the sides 1J are close to each other.

Even when the analog signals 7A and digital signals 7B are mixed on the small substrate 2, the analog signals 7A and digital signals 7B can be easily separated on the substrate 2, and the influence from the digital signals 7B can be minimized.

Figure 3:
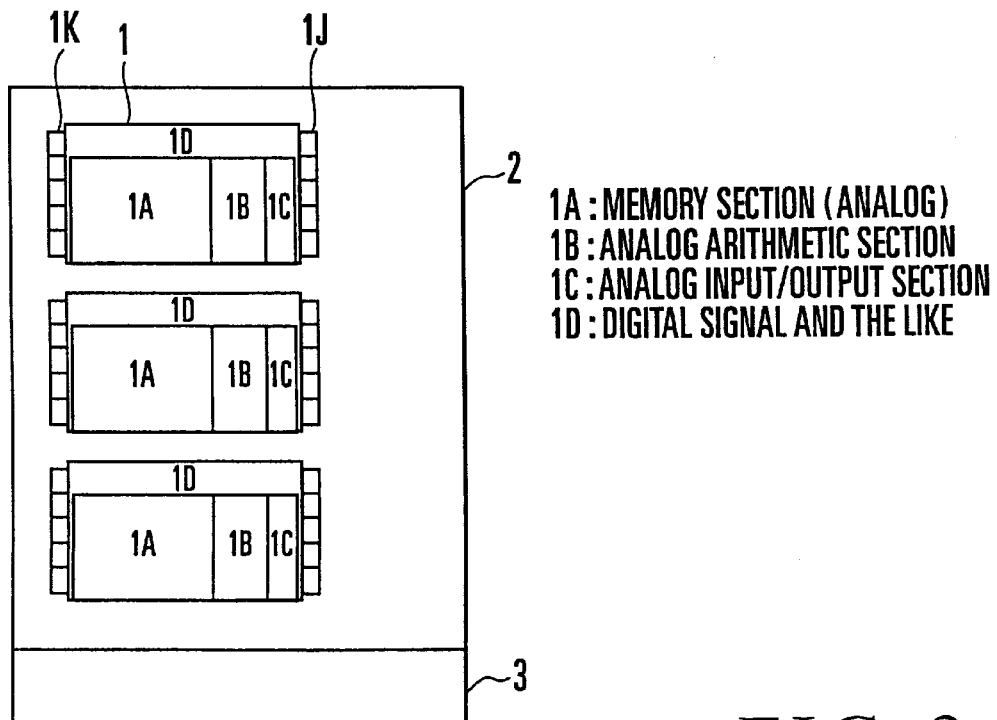
FIG. 3 is an explanatory view showing a component-mounted card type semiconductor memory device in FIG. 2.

FIG. 3 shows the internal arrangement of each memory chip.

A memory section 1A is formed from an analog nonvolatile semiconductor memory for storing an analog signal as an analog value and stores a color interleaved analog image signal input via an analog input/output section 1C.

A color interleaved analog image signal read out from the memory section 1A is arithmetically processed as an analog value and converted into a color image signal by an analog arithmetic section 1B, and then output through the analog input/output section 1C. The color interleaved analog image signal may be directly read out without any conversion.

These circuit sections for processing an analog signal are separated from a digital signal section ID where digital signals including address signals and various control signals are concentrated.

Hence, even in the memory chip 1, the interference from a digital signal to an analog signal can be reduced.

Figure 4A:
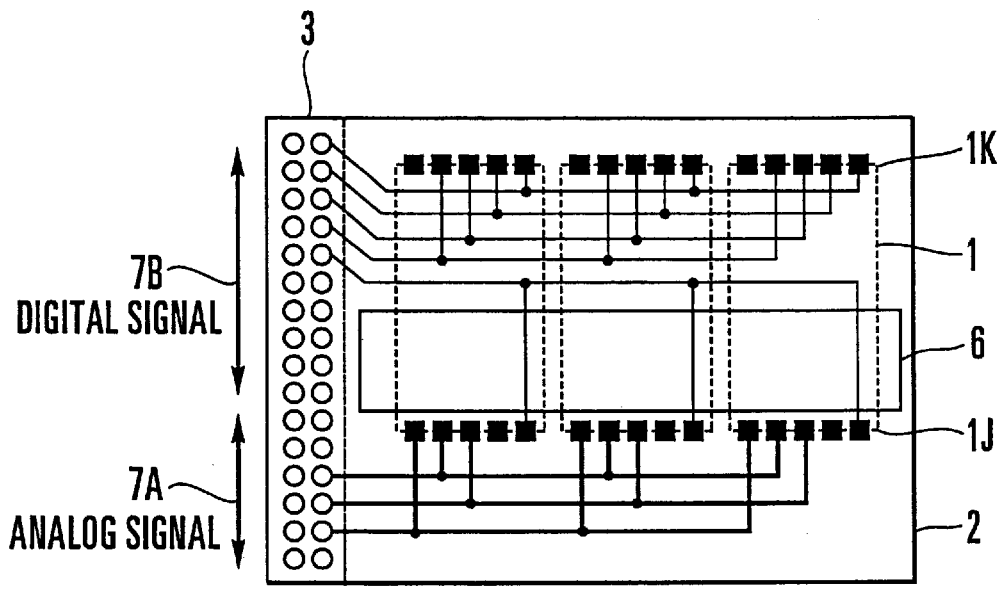
FIGS. 4A, 4B and 4C are explanatory views showing a two-surface-mounted card type semiconductor memory device.
Figure 4B:
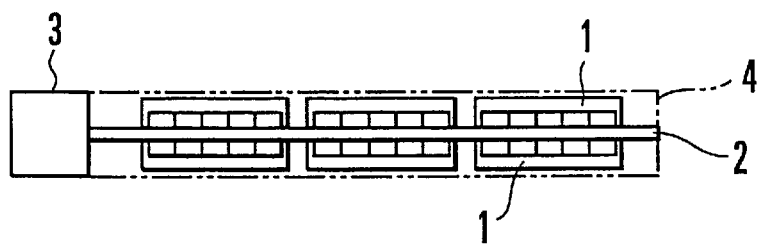
Figure 4C:
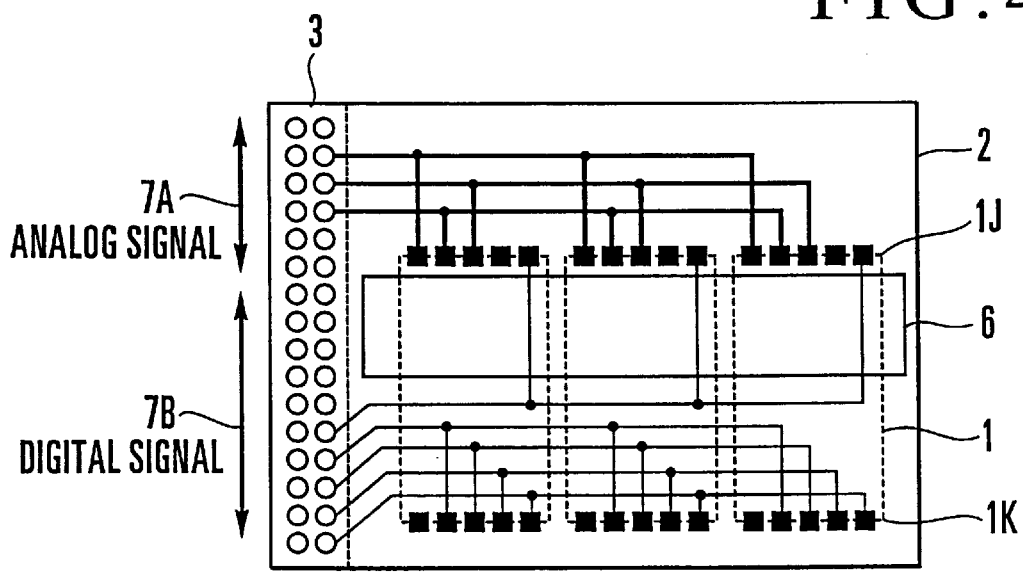

As shown in FIGS. 4A to 4C, even when the memory chips 1 are mounted on both surfaces of the memory chip 1, the present invention can be applied as described above.

In this case, the analog signals 7A and digital signals 7B on the substrate surfaces are arranged at almost identical positions via the substrate 2. With this arrangement, the interference from a digital signal to an analog signal can be reduced.

Figure 5:
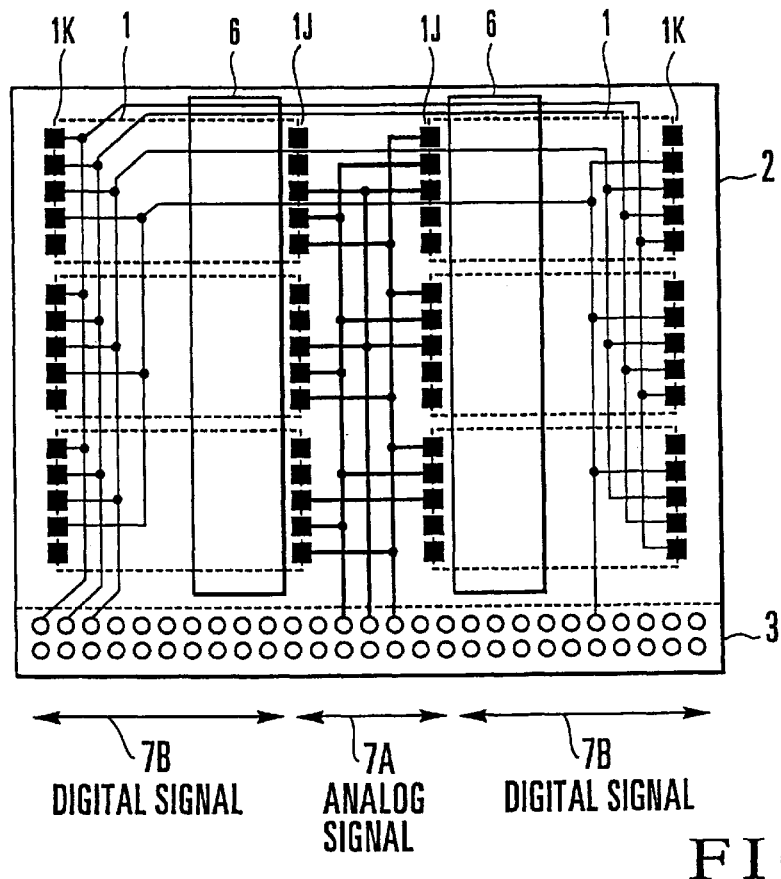
FIG. 5 is an explanatory view showing another example of the wiring pattern.

As shown in FIG. 5, even when the memory chips 1 are mounted in two arrays, the present invention can be applied as described above.

Figure 6:
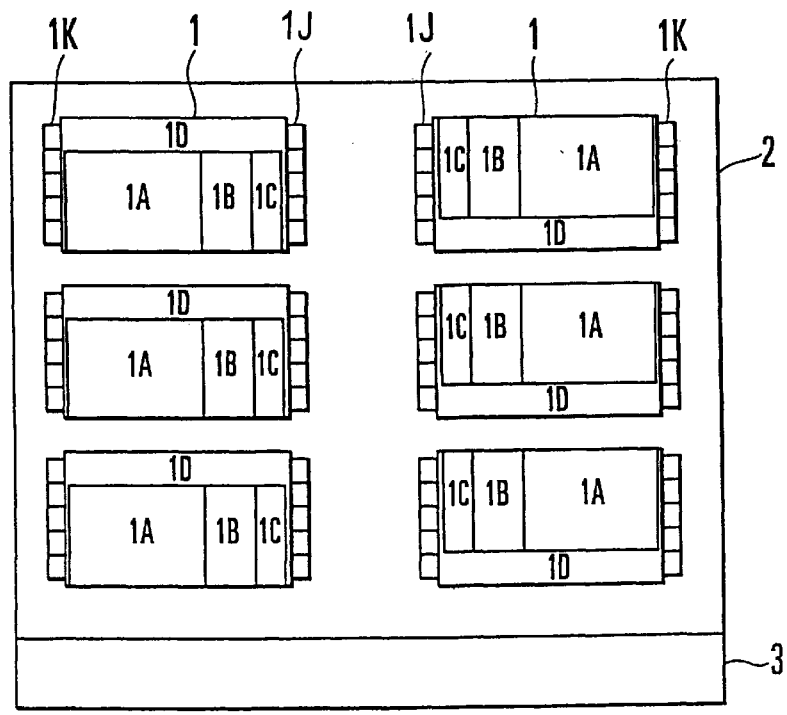
FIG. 6 is an explanatory view showing a component-mounted card type semiconductor memory device in FIG. 5.

In this case, as shown in FIG. 6, the memory chips 1 of the respective arrays are parallelly arranged in reverse directions such that the sides 1J with analog signal terminals are close to each other.

The analog signals 7A connected to the memory chips 1 of the two arrays can be concentrated to the central portion of the substrate 2. For this reason, even when a number of memory chips 1 are mounted, the analog signals can be easily separated from the digital signals 7B.

As shown in FIG. 7, an A/D conversion section 1E may be prepared in each memory chip 1 to convert an analog color image signal generated by the analog arithmetic section 1B into a digital signal and output it.

With this arrangement, the interference from a digital signal to a color image signal can be completely prevented outside the memory chip 1.

When the A/D conversion section 1E is to be formed in the memory chip 1, the A/D conversion section 1E is formed at the boundary portion between the analog circuit area and the digital signal area, e.g., the boundary portion of the analog arithmetic section 1B for generating a color image signal from a color interleaved analog image signal. In this case, the interference from a digital signal to an analog signal can be prevented in the memory chip 1.

In the above description, a connector of terminal fitting type has been exemplified as the connector 3. As shown in FIG. 8, a connector of terminal contact type may be used.

Referring to FIG. 8, a terminal group 8 forming the connector 3 is formed as a conductive pattern on a substrate surface on the opposite side of the component mounting surface of the substrate 2.

In this case, the same wiring pattern as in FIG. 5 is used on the component mounting surface side. In the terminal group 8, the analog signals 7A are connected to terminals at the central portion to reduce the interference from the digital signals 7B.

As has been described above, according to the present invention, the analog signal line group from each memory chip is separated from the digital signal line group. In addition, a separation strip as a wide conductive pattern is formed between the analog signal line group and the digital signal line group. The analog signal terminals of each memory chip are concentrated to a predetermined side of the chip package. The memory chips are parallelly arranged such that the sides are close to each other, so the analog signal line group and the digital signal line group can be effectively separated.

With this arrangement, the interference from a digital signal to an analog signal can be minimized, and image information with high quality can be written or read at a high speed.

What is claimed is:

1. A card type semiconductor memory device comprising:
a plurality of analog nonvolatile semiconductor memory chips, where each of said analog nonvolatile semiconductor memory card chips stores a still image formed from a color interleaved analog image signal as mere analog values in units of pixels;
connection means configured to connect a plurality of signal lines to a host device, said connection means for transferring various signals between said memory chips and said host device, said connection means being arranged on a card-like substrate;
an analog signal line group coupled to each of said memory chips, said analog signal line group separated from a digital signal line group on said substrate via a separation strip formed from a wide conductive pattern, said analog signal line group concentratedly laid out to converge at said connection means, and said connection means for said analog signal line group separated from said digital signal line group at said connection means; and
terminals in each of said memory chips for said analog signal line group, said terminals being concentrated at a terminal array provided on a predetermined side of said card-like substrate.

2. The card type semiconductor memory device according to claim 1, wherein each of said memory chips comprises analog nonvolatile semiconductor memories, an analog circuit area, and a digital circuit area, said analog circuit area having circuit sections for processing analog signals, wherein input/output to/from said analog nonvolatile semiconductor memories is concentrated in each of said memory chips in said analog circuit area, said analog circuit area being separated from said digital circuit area in each of said memory chips, and wherein digital signal lines such as address signal lines and various control signal lines are concentrated in said digital circuit area.

3. The card type semiconductor memory device according to claim 1, wherein each of said analog memory card chips has an analog to digital converter ("A/D converter"), said A/D converter being placed as a part of said analog memory card chip, said A/D converter being operative to convert said still image generated from said color interleaved analog image signal and merely outputting digital signals.

4. The card type semiconductor memory device according to claim 3, wherein said A/D converter is placed at a boundary portion between said analog circuit area and said digital circuit area.

5. The card type semiconductor memory device according to claim 1, wherein said memory chips are arranged in parallel to each other, where edges of each of said memory chips are located close to each other on said card-like substrate.

6. The card type semiconductor memory device according to claim 1, wherein said still image signal is generated from said color interleaved analog image signal via said arithmetic section, and wherein said analog nonvolatile semiconductor memories are used to store said color interleaved analog image signal, said color interleaved analog image signal being represented as analog charge values with amplitudes corresponding to the luminance values of the pixels of said still image.

* * * * *